(12) United States Patent
Browning et al.

(10) Patent No.: US 11,100,032 B2
(45) Date of Patent: *Aug. 24, 2021

(54) METHODS AND APPARATUS FOR PROGRAMMING AN INTEGRATED CIRCUIT USING A CONFIGURATION MEMORY MODULE

(71) Applicant: Intel Corporation, Santa Clara, CA (US)

(72) Inventors: David Browning, Portland, OR (US); Brandon Courtney, Hillsboro, OR (US); John Eley, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 44 days.

This patent is subject to a terminal disclaimer.

(21) Appl. No.: 16/780,713

(22) Filed: Feb. 3, 2020

(65) Prior Publication Data
US 2020/0174959 A1 Jun. 4, 2020

Related U.S. Application Data

(63) Continuation of application No. 16/157,989, filed on Oct. 11, 2018, now Pat. No. 10,572,430.

(51) Int. Cl.
*G06F 13/40* (2006.01)
*G06F 13/16* (2006.01)
*H05K 1/18* (2006.01)
*G06F 1/20* (2006.01)
*H05K 1/02* (2006.01)

(52) U.S. Cl.
CPC .......... *G06F 13/4068* (2013.01); *G06F 1/206* (2013.01); *G06F 13/1668* (2013.01); *H05K 1/029* (2013.01); *H05K 1/181* (2013.01); *H05K 2201/10159* (2013.01);
(Continued)

(58) Field of Classification Search
CPC .. G06F 13/4068; G06F 1/206; G06F 13/1668; G06F 13/385; G06F 13/387; G06F 13/4022; G06F 13/4027; G06F 2213/4002; H05K 1/181; H05K 2201/10325; H05K 2201/10522
See application file for complete search history.

(56) References Cited

U.S. PATENT DOCUMENTS 7,032,158 B2 4/2006 Alvarez, II et al.
7,197,575 B2 3/2007 Huppenthal et al.
(Continued)

*Primary Examiner* — Raymond N Phan
(74) *Attorney, Agent, or Firm* — Fletcher Yoder P.C.

(57) ABSTRACT

An integrated circuit may include a printed circuit board and multiple processor sockets on the printed circuit board. Each of the multiple processor sockets is operable to receive a microprocessor and a programmable device. When a microprocessor is placed in a processor socket, that microprocessor may communicate with memory dual in-line memory modules (DIMMs). When a programmable device is placed in a processor socket, that programmable device may first be configured using a configuration DIMM and may then communicate with memory DIMMs during normal operation. The configuration DIMM may include multiple options for configuring the programmable device and may also provide additional management functions specifically tailored to the programmable device.

19 Claims, 8 Drawing Sheets

(52) U.S. Cl.
CPC .............. *H05K 2201/10212* (2013.01); *H05K 2201/10325* (2013.01); *H05K 2201/10522* (2013.01)

(56) References Cited

U.S. PATENT DOCUMENTS

| | | | |
|---|---|---|---|
| 7,565,461 | B2 | 7/2009 | Huppenthal et al. |
| 8,134,875 | B2 | 3/2012 | Baxter |
| 9,600,413 | B2 | 3/2017 | Ray et al. |
| 10,572,430 | B2 * | 2/2020 | Browning .............. H05K 1/029 |
| 2002/0016897 | A1 | 2/2002 | Nerl |
| 2011/0161592 | A1 | 6/2011 | Nachimuthu et al. |
| 2011/0179311 | A1 | 7/2011 | Nachimuthu et al. |
| 2011/0227605 | A1 * | 9/2011 | Watanabe ........ H03K 19/17758 326/38 |
| 2012/0117318 | A1 | 5/2012 | Burton et al. |
| 2013/0007679 | A1 * | 1/2013 | Mendel ............ H03K 19/17756 716/106 |
| 2013/0181738 | A1 * | 7/2013 | Alves ............... H03K 19/00315 326/9 |
| 2016/0314822 | A1 * | 10/2016 | Yeung ..................... G06F 13/16 |
| 2018/0020054 | A1 | 1/2018 | Woodacre et al. |
| 2019/0042221 | A1 | 2/2019 | Krishnaiyer et al. |
| 2019/0095352 | A1 * | 3/2019 | Poornachandran .......................... G06F 12/1408 |

\* cited by examiner

METHODS AND APPARATUS FOR PROGRAMMING AN INTEGRATED CIRCUIT USING A CONFIGURATION MEMORY MODULE

This application is a continuation of U.S. patent application Ser. No. 16/157,989, filed Oct. 11, 2018, which is hereby incorporated by reference herein in its entirety.

BACKGROUND

A computer system typically includes electronic components mounted on a motherboard. The motherboard includes a number of sockets configured to receive microprocessors sometimes referred to as a central processing units (CPUs). For instance, a dual-socket motherboard can be populated with one or two CPUs.

More recently, there has been an emphasis on the need to add programmable integrated circuits such as programmable logic devices (PLDs) to help improve the performance or processing capability of the computer system. One proposed solution involves encapsulating both a CPU and a PLD within a single multichip package, where the multichip package can then be inserted into an existing CPU socket. This multichip package (MCP) platform, however, is too limiting in terms of performance since it requires the CPU and the PLD to share a common cooling mechanism.

Another proposed solution involves forming PLDs on existing Peripheral Component Interconnect Express (PCIe) cards. These PCIe cards are coupled to one of the CPUs via a PCIe bus. In a multi-socketed system where two or more CPUs communicate with one another via a coherent low-latency CPU-to-CPU bus, it is challenging for the PLDs on the PCIe cards to communicate with the CPU-to-CPU bus, either because all the CPU-to-CPU links are already consumed by the microprocessors or because there is no natural communications path from the CPU-to-CPU bus onto the PCIe card.

It is within this context that the embodiments described herein arise.

DETAILED DESCRIPTION

The present embodiments relate to a computer system having a printed circuit board with one or more sockets, each of which is operable to receive a microprocessor and a programmable integrated circuit. When a microprocessor is inserted into a given socket, that microprocessor may communicate normally with external memory modules also mounted on the printed circuit board. On the other hand, when a programmable integrated circuit is inserted into a given socket, that programmable integrated circuit may be configured using a configuration module mounted on the printed circuit board. After configuration operations, the programmable integrated circuit may then communicate normally with other external memory modules mounted on the printed circuit board.

This solution allows a programmable integrated circuit to be inserted into an existing microprocessor socket while providing a mechanism for configuring the programmable integrated circuit. It will be recognized by one skilled in the art, that the present exemplary embodiments may be practiced without some or all of these specific details. In other instances, well-known operations have not been described in detail in order not to unnecessarily obscure the present embodiments.

Figure 1:
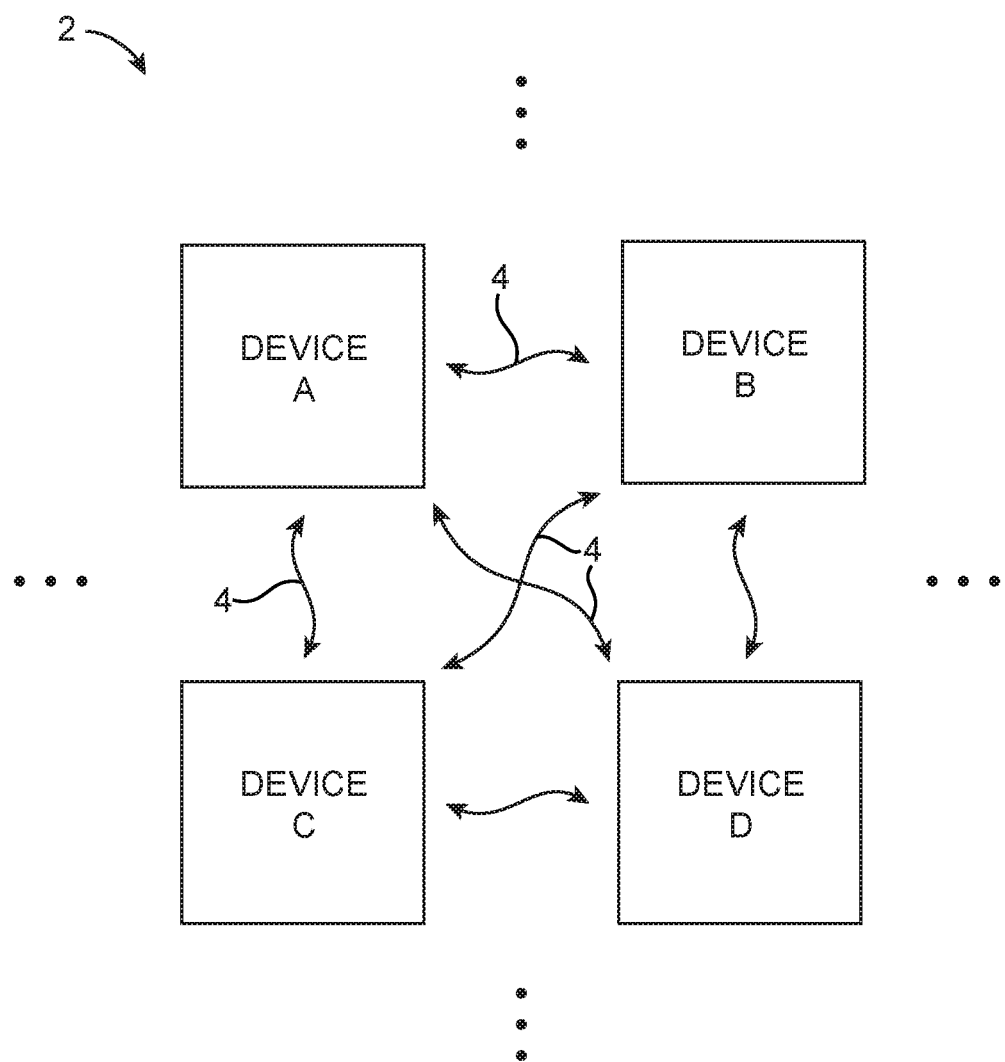
FIG. 1 is a diagram of an illustrative system of integrated circuit devices operable to communicate with one another in accordance with an embodiment.

FIG. 1 is a diagram of an illustrative system 2 of interconnected electronic devices. As shown in FIG. 1, system 2 may include multiple electronic devices such as device A, device B, device C, device D, and interconnection resources 4. Interconnection resources 4 such as conductive lines and busses, optical interconnect infrastructure, or wired and wireless networks with optional intermediate switching circuitry may be used to send signals from one electronic device to another electronic device or to broadcast information from one electronic device to multiple other electronic devices. For example, a transmitter in device B may transmit data signals to a receiver in device C. Similarly, device C may use a transmitter to transmit data to a receiver in device B.

The electronic devices may be any suitable type of electronic device that communicates with other electronic devices. Examples of such electronic devices include basic electronic components and circuits such as analog circuits, digital circuits, mixed-signal circuits, one or more circuits formed in an integrated circuit package, circuits housed within different packages, circuits that are interconnected on a printed-circuit board (PCB), etc.

Figure 2:
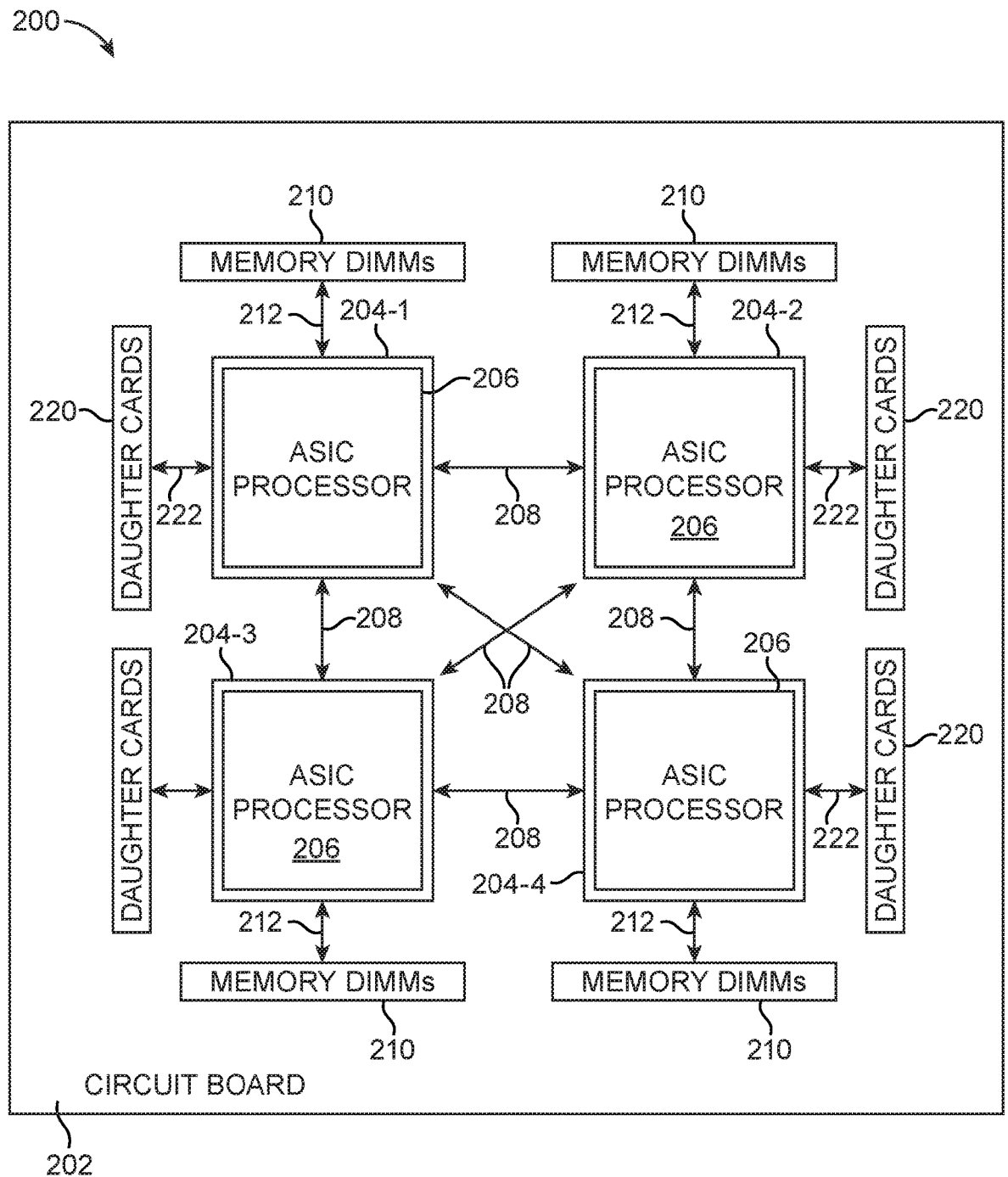
FIG. 2 is a diagram of an illustrative quad-socket processor platform in accordance with an embodiment.

A computer system may include one or more integrated circuit devices mounted on a printed circuit board. FIG. 2 is a top layout view of an illustrative multi-socketed integrated circuit platform or system 200. As shown in FIG. 2, system 200 may include a printed circuit board such as circuit board 202 (sometimes referred to as a motherboard) and a number of processor sockets such as sockets 204-1, 204-2, 204-3, and 204-4 mounted on circuit board 202.

In the example of FIG. 2, an application-specific integrated circuit (ASIC) processor such as ASIC processor 206 may be inserted into or mounted on each of the four processor sockets 204. This is merely illustrative. In general, each socket 204 may be configured to receive or mate with a microprocessor (e.g., an x86 microprocessor such as an Intel® Xeon® processor by INTEL Corporation, a reduced instruction set computer (RISC), or an Advanced RISC Machine (ARM) processor), a microcontroller, a central processing unit (CPU), an application-specific standard product (ASSPs), a graphics processing unit (GPU), or other processing component having one or more processor cores formed within a single package.

Processors 206 mounted within sockets 204 may communicate with one another via processor-to-processor interconnect paths such as paths 208. Paths 208 may be any low latency coherent point-to-point interconnect such as the UltraPath Interconnect (UPI) interface developed by INTEL Corporation (as an example). Paths 208 may be suitable for linking together any number of processing devices in a scalable multiprocessor system while optionally using a shared address space.

Figure 4:
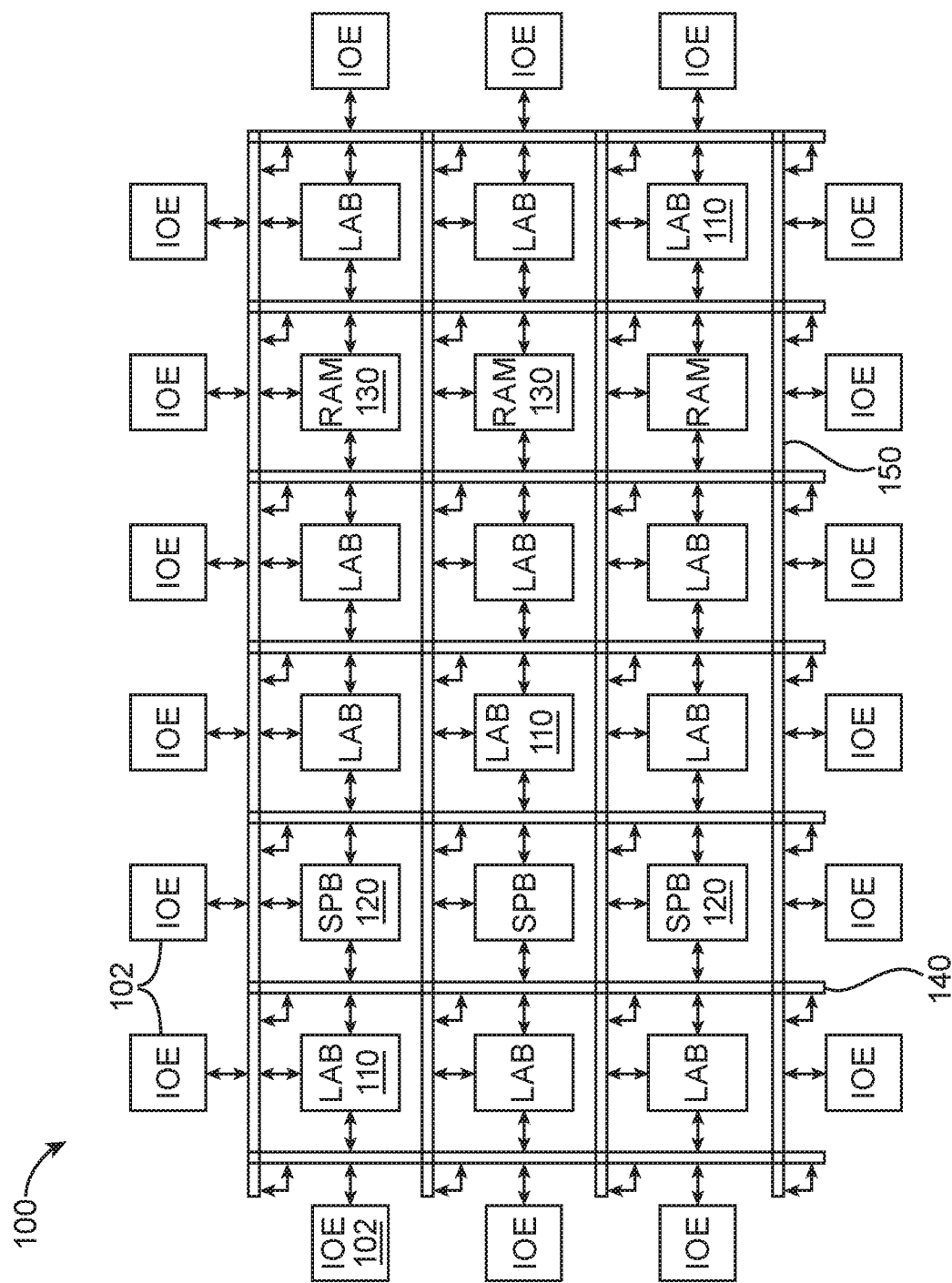
FIG. 4 is a diagram of an illustrative programmable integrated circuit in accordance with an embodiment.

Paths 208 may be formed as physical traces between any two pairs of sockets 204 on circuit board 202 and is generally not exposed to outside devices external to circuit board 202. In the example of FIG. 4 where there are four processor sockets 204, there may be $_4C_2$ or six separate UPI interfaces 208. In another example where there are only two processor sockets, there may be $_2C_2$ or two separate UPI interfaces 208. In yet another example where there are only six processor sockets, there may be $_6C_2$ or 15 separate UPI interfaces 208. These examples are merely illustrative and are not intended to limit the scope of the present embodiments.

Processors 206 mounted within sockets 204 may also communicate with one or more daughter cards 220 via paths 222. Paths 222 may be general-purpose links coupling processor sockets 204 to one or more expansion slots in which the daughter cards 220 can be inserted. Types of daughter cards 220 that may be inserted into these expansion slots include a graphics adapter card, a video card, a sound card, a network interface controller (NIC) daughterboard, a Bluetooth daughterboard, a modem daughterboard, a server management daughterboard, an expanded memory daughterboard, or other suitable accessory card to add functionality to the socketed processors. Paths 222 are therefore sometimes referred to as high-speed input-output expansion buses. Types of expansion bus/slot standards that can be supported by paths 222 may include the PCI (Peripheral Component Interconnect) interface, Peripheral Component Interconnect Express (PCIe) interface, Industry Standard Architecture (ISA) interface, Accelerated Graphics Port (AGP) interface, Communications and Networking Riser (CNR) interface, Audio/Modem Riser (AMR) interface, Video Electronics Standards Association (VESA) interface, or other suitable computer bus interface standards.

Still referring to FIG. 2, processors 206 mounted within sockets 204 may further communicate with external memory devices such as dual in-line memory modules (DIMMs) 210 via paths 212. DIMMs 210 may include dynamic random-access memory (DRAM) components such as synchronous dynamic random-access memory (SDRAM) components configured to offer primary data storage for processors 206. DIMMs 210 may therefore be referred to as memory DIMMs 210. Each memory DIMM 210 may be inserted into a corresponding memory module slot on circuit board 202.

External memory interfaces (EMIFs) that are supported by paths 212 may include double data rate (DDR) interfaces such as DDR type-3 (DDR3), low power DDR3 (LPDDR3), DDR type-4 (DDR4), low power DDR4 (LPDDR4), DDR type-5 (DDR5), graphics DDRx, quad data rate (QDR), or other suitable interfaces for communicating with a memory DIMM 210. The example of FIG. 2 in which processors 206 are all coupled to memory DIMMs 210 is merely illustrative. If desired, other types of memory modules such as single in-line memory modules SIMMs) or Rambus in-line memory modules (RIMMs) may be installed within the memory module slots.

Figure 3:
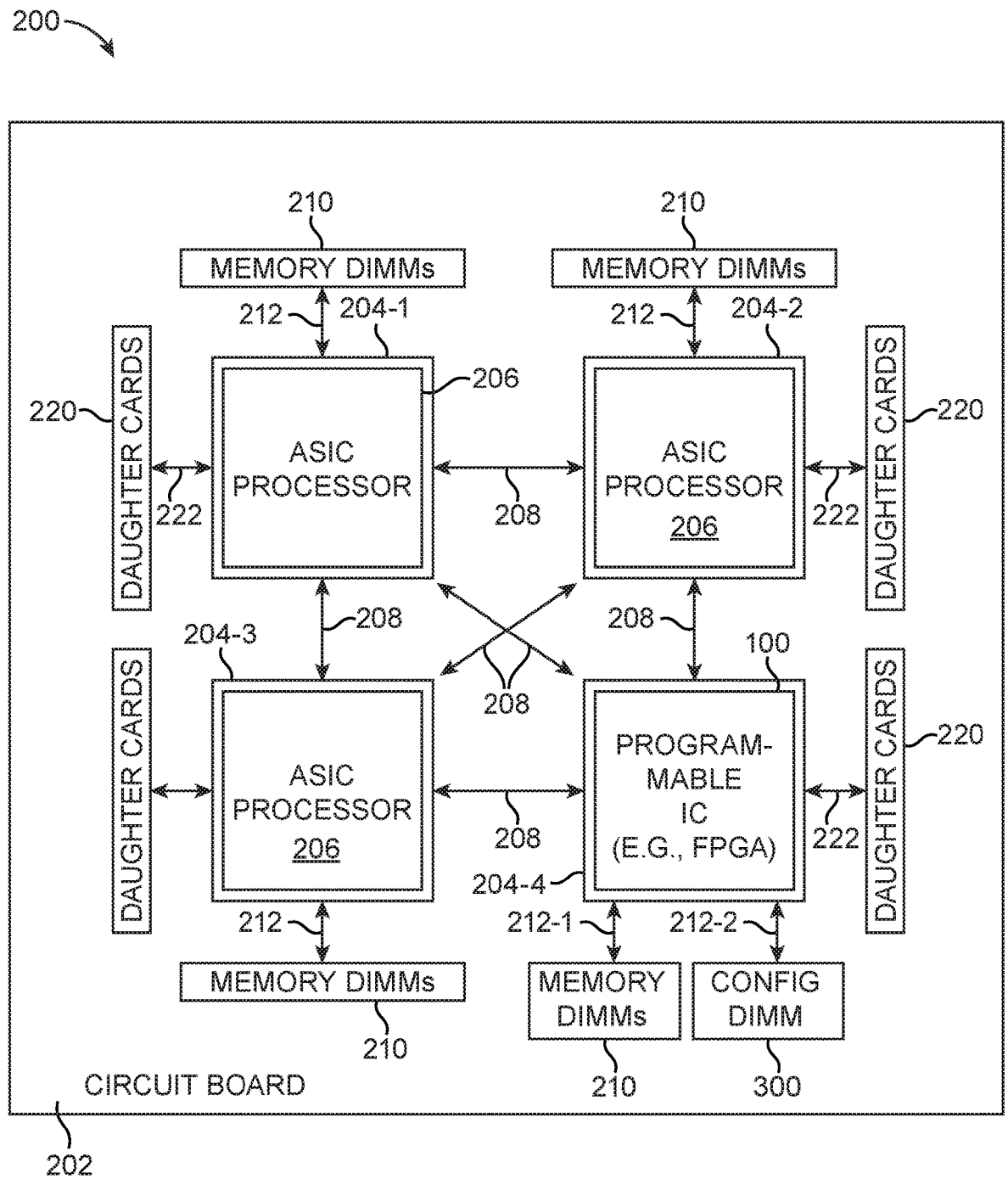
FIG. 3 is a diagram showing how the multi-socketed processor platform of FIG. 2 can receive a programmable integrated circuit in accordance with an embodiment.

The example of FIG. 3 in which all of sockets 204-1, 204-2, 204-3, and 204-4 are populated by ASIC microprocessors 206 is merely illustrative. Recently, there has been a need to add programmable integrated circuits to a computer system. For example, programmable devices may be used for co-processing in big-data or fast-data applications. Programmable devices may be used in application acceleration tasks in a data center and may be reprogrammed during data center operation to perform different tasks. By offloading computationally intensive tasks from a host processor to highly-parallel acceleration resources on a programmable device (sometimes referred to as a co-processor or an acceleration processor), the host processor is freed up to perform other critical processing tasks. The use of programmable devices as hardware accelerators can therefore help deliver improved speeds, latency, power efficiency, and flexibility for end-to-end cloud computing, networking, storage, artificial intelligence, autonomous driving, virtual reality, augmented reality, gaming, and other data-centric applications.

In accordance with an embodiment, processors sockets 204 on circuit board 202 may also be configured to receive and mate with a programmable logic device (e.g., sockets 204 may be designed to be also compatible with a programmable device or the programmable device may be designed to be compatible with processor sockets 204). Examples of programmable logic devices include programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

Device configurations in which a programmable device 100 (e.g., an FPGA) is mounted within a processor socket such as socket 204-4 may sometimes be described herein as an example (see FIG. 3). This is, however, merely illustrative. In general, programmable device 100 may be installed into any number of sockets 204 on circuit board 202, two or more sockets 204 may be populated by two separate FPGA packages, at least three sockets 304 may be populated by three separate FPGA packages, or even all of sockets 204 may be populated by four different FPGA packages.

As shown in FIG. 3, programmable device 100 may replace a microprocessor 206 within socket 204-4. Mounted in this way, programmable device 100 may leverage the existing processor routing connections. For example, programmable device 100 may be configured to communicate directly with other microprocessors 206 via paths 208 (e.g., FPGA 100 may be capable of leveraging existing UPI interfaces 208), to communicate directly with other daughter cards via paths 222 (e.g., FPGA 100 may be capable of leveraging existing PCIe interfaces 222), or to use other existing interconnects coupled to socket 204-4 for storage, power delivery, and other required operations.

Unlike a microprocessor, which is typically hardwired to provide a specific functionality, programmable device 100 has to be configured or programmed using configuration data (sometimes referred to as a configuration bitstream) prior to normal operation so that device 100 is configured to provide a desired user-selected custom logic function. Since conventional configuration mechanisms do not exist in a multi-socketed microprocessor platform, there needs to be some way to configure programmable device 100 when it is mounted within a processor socket 204.

In general, processor socket 204 allows for attachment of a large number of memory channels. For example, a single processor socket 204 may have sufficient pinout to support at least six, seven, eight, or more memory channels, where each memory channel is coupled to a respective DIMM slot. In practice, however, programmable device 100 may be capable of using only a subset of these memory channels. As an example, FPGA 100 might only be connected to four out of the six available memory channels. In accordance with an embodiment, any of the remaining unused memory channels may be leveraged as a configuration path for programming device 100. In other words, at least one of the existing memory routing of multi-socketed platform 200 can be leveraged by loading in FPGA configuration signals instead of conveying memory signals.

This is illustrated in the example of FIG. 3, where a first portion of memory channels 212-1 is coupled to memory DIMMs 210 and where a second portion of memory channels 212-2 is coupled to a configuration DIMM 300. While memory DIMMs 210 are used to provide primary/main storage for programmable device 100, configuration DIMM 300 is used to load configuration data or to otherwise program device 100 prior to normal operation. In the example of FIG. 3, only one configuration DIMM 300 is coupled to FPGA 100 via a single memory channel. This is merely illustrative. If desired more than one configuration DIMM 300 can be inserted into any unused or unoccupied DIMM slot(s) associated with processor socket 204-4 on circuit board 202 (i.e., more than one memory channel 212-2 can be used for configuration purposes).

FIG. 4 is a diagram of an illustrative programmable integrated circuit device 100 (e.g., a programmable logic device or FPGA). Device 100 may be formed within an integrated circuit package, which can then be inserted into any one of processor sockets 204 on circuit board 202 (FIG. 3). As shown in FIG. 4, the programmable logic device (PLD) 100 may include a two-dimensional array of functional blocks, including logic array blocks (LABs) 110, random access memory (RAM) blocks 130, and specialized processing blocks such as specialized processing blocks (SPB) 120. Functional blocks such as LABs 110 may include smaller programmable regions (e.g., logic elements, configurable logic blocks, or adaptive logic modules) that receive input signals and perform custom functions on the input signals to produce output signals. Specialized processing blocks 120 may include arithmetic circuitry for performing multiply-accumulate operations (as an example) and is sometimes referred to as digital signal processing (DSP) blocks.

Device 100 may contain programmable memory elements. Memory elements may be loaded with configuration data (also called programming data) using input/output elements (IOEs) 102. Once loaded, the memory elements each provide a corresponding static control signal that controls the operation of an associated functional block (e.g., LABs 110, SPB 120, RAM 130, or input/output elements 102). In a typical scenario, the outputs of the loaded memory elements are applied to the gates of metal-oxide-semiconductor transistors in a functional block to turn certain transistors on or off and thereby configure the logic in the functional block including the routing paths. Programmable logic circuit elements that may be controlled in this way include parts of multiplexers (e.g., multiplexers used for forming routing paths in interconnect circuits), look-up tables, logic arrays, AND, OR, NAND, and NOR logic gates, pass gates, etc.

The memory elements may use any suitable volatile and/or non-volatile memory structures such as random-access-memory (RAM) cells, fuses, antifuses, programmable read-only-memory memory cells, mask-programmed and laser-programmed structures, mechanical memory devices (e.g., including localized mechanical resonators), mechanically operated RAM (MORAM), combinations of these structures, etc. Because the memory elements are loaded with configuration data during programming, the memory elements are sometimes referred to as configuration memory, configuration RAM (CRAM), configuration memory elements, or programmable memory elements.

In addition, the programmable logic device may have input/output elements (IOEs) 102 for driving signals off of device 100 and for receiving signals from other devices. Input/output elements 102 may include parallel input/output circuitry, serial data transceiver circuitry, differential receiver and transmitter circuitry, or other circuitry used to connect one integrated circuit to another integrated circuit. As shown, input/output elements 102 may be located around the periphery of the chip. If desired, the programmable logic device may have input/output elements 102 arranged in different ways.

Device 100 may also include programmable interconnect circuitry in the form of vertical routing channels 140 (i.e., interconnects formed along a vertical axis of PLD 100) and horizontal routing channels 150 (i.e., interconnects formed along a horizontal axis of PLD 100), each routing channel including at least one track to route at least one wire. If desired, the interconnect circuitry may include double data rate interconnections and/or single data rate interconnections.

Note that other routing topologies, besides the topology of the interconnect circuitry depicted in FIG. 4, are intended to be included within the scope of the present invention. For example, the routing topology may include diagonal wires, horizontal wires, and vertical wires along different parts of their extent as well as wires that are perpendicular to the device plane in the case of three dimensional integrated circuits, and the driver of a wire may be located at a different point than one end of a wire. The routing topology may include global wires that span substantially all of device 100, fractional global wires such as wires that span part of device 100, staggered wires of a particular length, smaller local wires, or any other suitable interconnection resource arrangement.

If desired, the functional blocks of such an integrated circuit may be arranged in more levels or layers in which multiple functional blocks are interconnected to form still larger blocks. Other device arrangements may use functional blocks that are not arranged in rows and columns.

Figure 5:
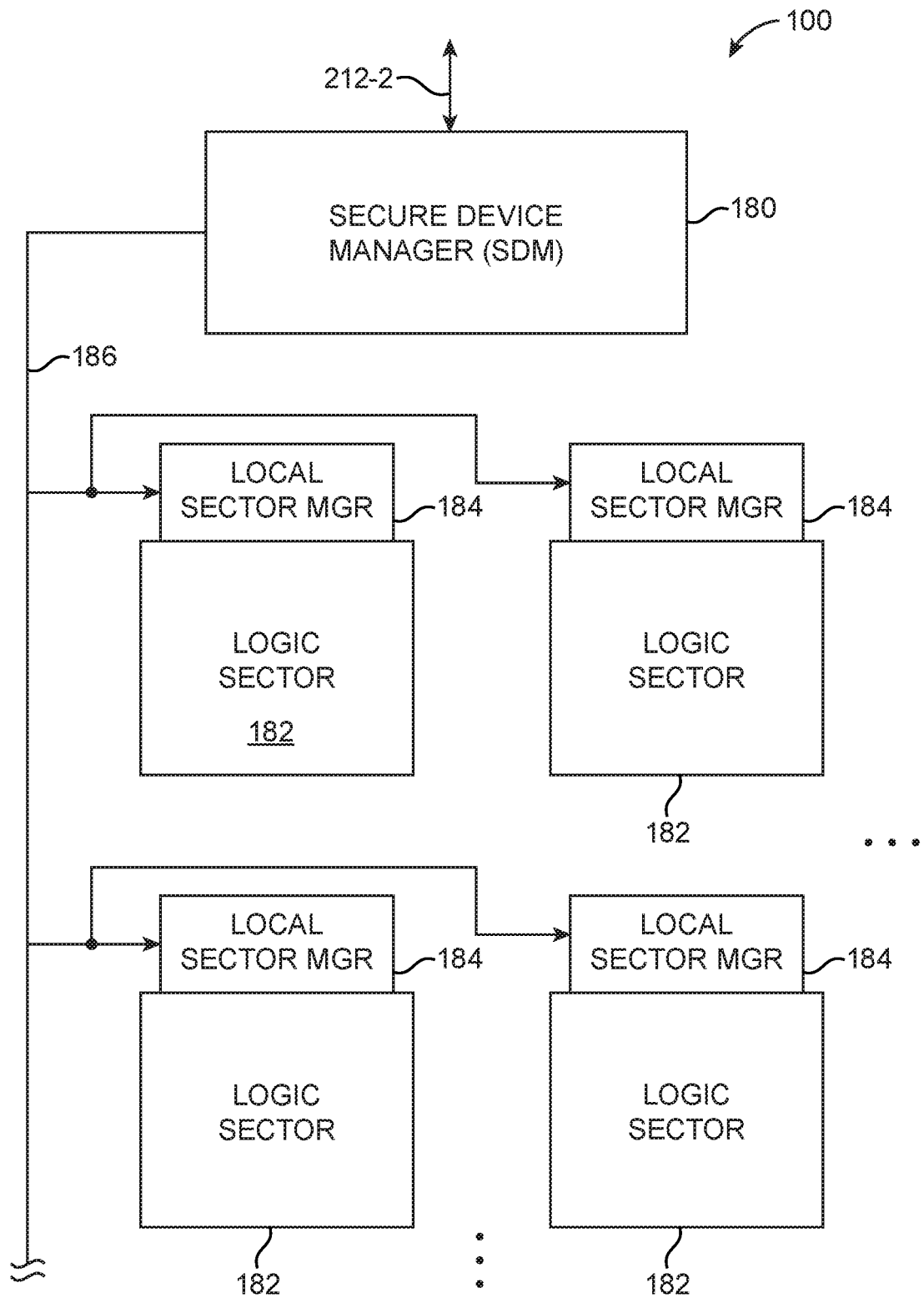
FIG. 5 is a diagram of an illustrative programmable integrated circuit having multiple logic sectors controlled by local sector managers and a secure device manager in accordance with an embodiment.

In one suitable arrangement, the logic circuitry on device 100 may be organized into logic sectors (see, e.g., FIG. 5). As shown in FIG. 5, device 100 may include multiple logic sectors 182 (sometimes referred to as logic regions). Each logic sector 182 may be managed by a respective local sector manager (LSM) 184. Local sector managers 184 (sometimes referred to as logic region manager circuits) may be controlled by a secure controller such as secure device manager (SDM) 180. Secure device manager 180 may receive configuration data (e.g., configuration bit streams) and commands from an external host such as from a corresponding configuration DIMM over memory channel 212-2 and may then provide the received commands and configuration data to local sector managers 184 over an internal bus 186. Bus 186 coupling secure device manager 180 to local sector managers 184 may sometimes be referred to as a configuration network-on-chip (CNoC).

Logic sectors 182 may be individually configured or programmed using the associated local sector manager 184. This allows each of logic sectors 182 to independently process different tasks in parallel. The parallel processing enabled by logic sectors 182 may be utilized to perform application acceleration (e.g., in a datacenter) for a variety of tasks or jobs simultaneously by reconfiguring different subsets of the logic sectors to perform the different tasks.

In some instances, the received configuration data and commands may optionally be compressed and encrypted. Thus, secure device manager 180 or some other configuration circuit on device 100 may include a decompression and decryption circuit (not shown) for decompressing and decrypting data received from the external host (e.g., SDM 180 may include circuitry for decompressing and decrypting information received from the configuration DIMM via path 212-2).

Figure 6:
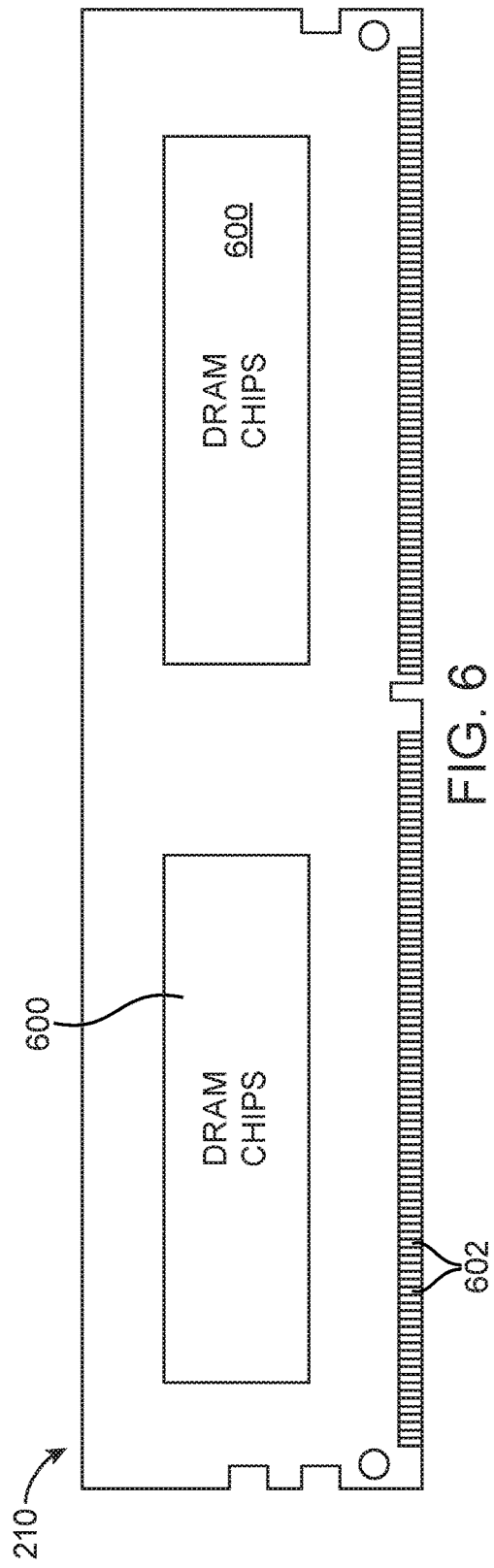
FIG. 6 is a diagram of a conventional dual in-line memory module (DIMM).

FIG. 6 is a diagram of a conventional memory DIMM 210. As shown in FIG. 6, DIMM 210 includes packaged dynamic random-access memory (DRAM) chips that communicate with either a microprocessor or a programmable device that is inserted within a processor socket 204 (FIG. 3). The contact leads 602 at the bottom of DIMM 210 may be inserted into a corresponding DIMM slot on circuit board 202. Once inserted, memory DIMM 210 may send and receive memory control and data signals to and from the socketed device via leads 602.

Figure 7:
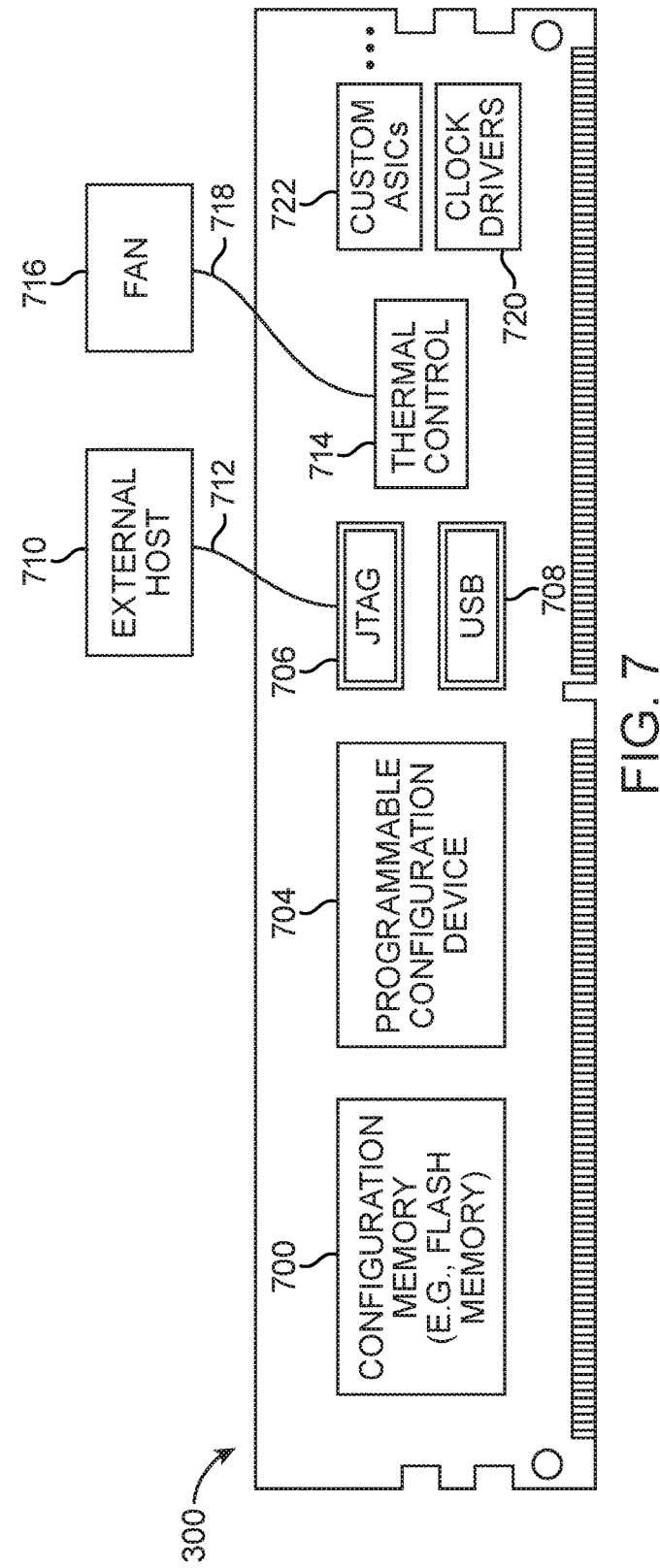
FIG. 7 is a diagram of an illustrative configuration DIMM that can be used to configure the programmable integrated circuit shown in FIG. 3 in accordance with an embodiment.

FIG. 7 is a diagram of an illustrative configuration DIMM 300 that can be used to configure a programmable device 100 that is inserted within processor socket 204. As shown in FIG. 7, configuration DIMM 300 may have the same form factor as the conventional memory DIMM 210 depicted in FIG. 6 (i.e., memory DIMM 210 and configuration DIMM 300 exhibit the same size and shape). Having the same form factor as a conventional memory DIMM allows the configuration DIMM 300 to be inserted into an existing DIMM slot without needing to redesign circuit board 202. In other words, when programmable device 100 is no longer needed in the system, device 100 may be removed from processor socket 204-4 (in the example of FIG. 3) while also removing the configuration DIMM 300, and both can be easily replaced with a microprocessor 206 and a conventional memory DIMM 210. This modular solution provides increased flexibility for the overall system while ensuring that device 100 can still be properly programmed without having to redesign circuit board 202.

Due to the large number of signal paths that is available in the external memory interface (EMIF), configuration DIMM 300 may be provided with multiple configuration options. In one suitable embodiment, configuration memory 700 may be formed directly on configuration DIMM 300. Configuration memory 700 may be implemented as flash memory (as an example) that stores the configuration data. For instance, configuration memory 700 may provide a configuration bitstream to FPGA 100 via a Serial Peripheral Interface during configuration operations.

In another suitable embodiment, a programmable configuration device such as device 704 may be formed directly on configuration DIMM 300. Programmable configuration device 704 may be implemented as another programmable integrated circuit device such as an FPGA (as an example) that has been pre-configured to program device 100 during configuration operations (e.g., device 704 may be tasked with the sole purpose of configuring device 100). Programmable configuration device 704 may itself be pre-programmed by connecting device 704 to an external host via a connector such as Universal Serial Bus (USB) connector 708. Connected in this way, the external host will provide the necessary configuration data to pre-program device 704. The use of a USB connector 708 is merely illustrative. If desired, other types of cabled connections can also be used.

In yet another suitable embodiment, an external connector such as Joint Test Action Group (JTAG) connector 706 may be formed directly on configuration DIMM 300. In particular, an external host such as external host computer 710 may be coupled to JTAG connector 706 via cable 712 during configuration operations. Connected in this way, host computer 710 may provide the necessary configuration bitstream to program device 100 during configuration operations (e.g., configuration DIMM 300 merely serves as a conduit for conveying the configuration bitstream to the socketed FPGA on the motherboard). The use of a JTAG connector 706 is merely illustrative. In general, other types of cabled connections can also be used. If desired, JTAG connector 706 may also be leveraged for debugging purposes, monitoring purposes, calibration purposes, or for other suitable tasks.

In addition to providing support for configuring device 100, other FPGA-specific management support functions could also be implemented on configuration DIMM 300. Some auxiliary tasks such as debugging and calibration have already been described above in connection with JTAG connector 706. In another suitable embodiment, configuration DIMM 300 may be provided with clock drivers 720 that generate a unique set of clock signals meeting specific frequency and jitter requirements of FPGA 100.

In yet another suitable embodiment, configuration DIMM 300 may be provided with a local thermal management control 714 that offer a thermal cooling profile optimized for FPGA 100 (as opposed to different thermal requirements of microprocessor 206). This could be a standalone component on configuration DIMM 300 such as thermal control unit 714, or could be part of the same configuration controller in device 704, either of which can drive an existing fan 716 via a cabled connection 718.

If desired, other custom ASIC chips 722 may be formed on configuration DIMM 300 to provide any desired auxiliary function for FPGA 100. Examples of ASIC chips 722 that may be included on configuration DIMM 300 include but are not limited to encryption circuits, audio codec circuits, network controller circuits, ARM-based processors, and/or other components that offer management support features specifically targeted for programmable device 100. Components provided these auxiliary functions might also be active during normal operation after device configuration.

The example of FIG. 7 in which the various components are all shown as mounted on one side of configuration DIMM 300 is merely illustrative. If desired, the various components may be formed on both sides of configuration DIMM 300. In general, configuration DIMM 300 need not include all of the components shown in FIG. 7 and may be provided with any combination of the components shown in FIG. 7. In yet another suitable arrangement, a hybrid DIMM may be provided, where a first portion includes DRAM chips 600 and where a section portion includes some or all of the components shown in FIG. 7. In such scenarios, the second portion of the hybrid DIMM will be active during device configuration, whereas the first portion of the hybrid DIMM will be active during normal operation.

The example of FIG. 3 in which quad-socket system 200 can support configuration of one or more programmable devices 100 using configuration DIMMs 300 is merely illustrative. If desired, the techniques describe above in connection with FIGS. 2-7 may also be applied to a dual-socket system 200 (see, e.g., FIG. 8), to a system with two to four processor sockets, to a system with more than four processor sockets, to a system with four to ten processor sockets, to a system with 10 or more processor sockets, or to any multi-socketed computer system.

Figure 8:
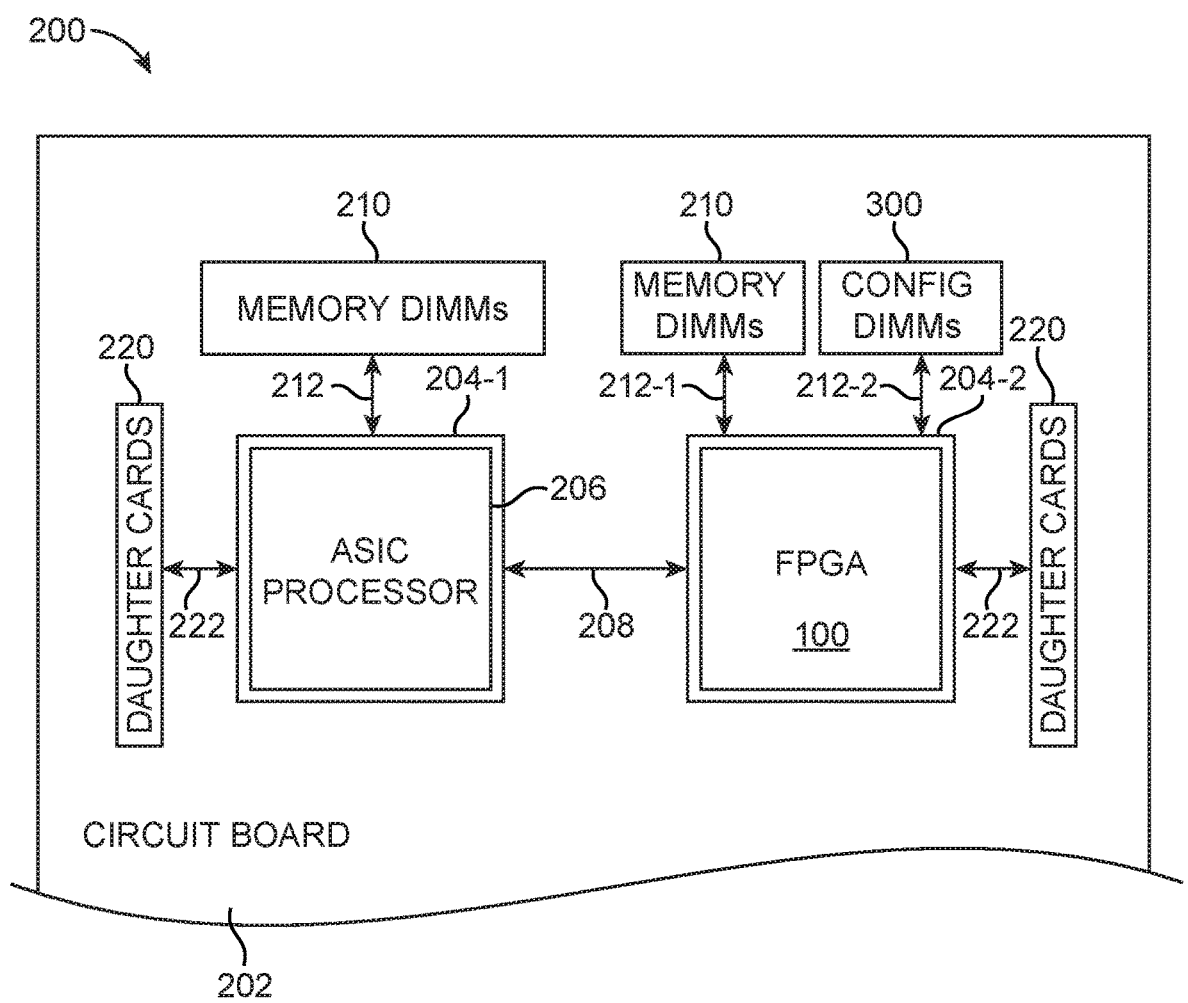
FIG. 8 is a diagram of an illustrative dual-socket processor platform operable to receive a programmable integrated circuit in accordance with an embodiment.

As shown in FIG. 8, FPGA 100 is mounted within socket 204-2. A first portion of memory channels 212-1 is coupled to memory DIMMs 210, whereas a second portion of memory channels 212-2 is coupled to configuration DIMMs 300. While memory DIMMs 210 are used to provide primary/main storage for programmable device 100, configuration DIMMs 300 are used to load configuration data or to otherwise program device 100 prior to normal operation. Although one link 208 is shown in FIG. 8, there may in general be any number of processor-to-processor links or signals paths to facilitate communications between the integrated devices mounted within the processor sockets. This is also true for the quad-socket example of FIGS. 2 and 3.

In the example of FIG. 8, multiple configuration DIMMs 300 are coupled to FPGA 100 via more than one memory channel. The example of FIG. 8 in which programmable device 100 is installed within socket 204-2 is merely illustrative. In general, programmable device 100 may be installed into any number of sockets 204 on circuit board 202. As examples, both sockets 204-1 and 204-2 may be populated with FPGA packages, or both sockets 204-1 and 240-2 may be populated with microprocessors 206.

Figure 9:
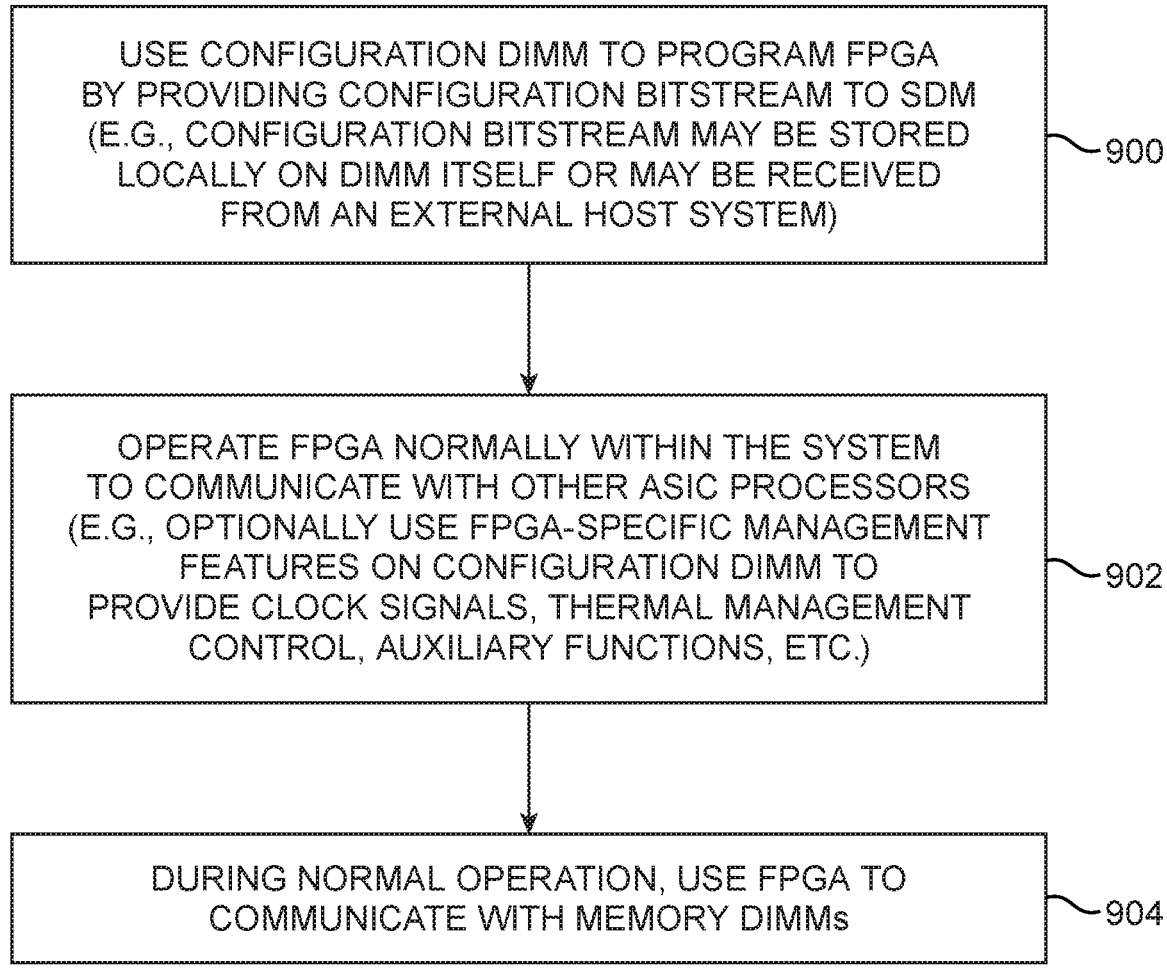
FIG. 9 is a flow chart of illustrative steps for operating a system of the type shown in connection with FIGS. 3-8 in accordance with an embodiment.

FIG. 9 is a flow chart of illustrative steps for operating a system of the type shown in connection with FIGS. 3-8 in accordance with an embodiment. At step 900, configuration DIMM 300 may be used to program FPGA 100 by providing a configuration bitstream to the secure device manager within FPGA 100 (see, e.g., SDM 180 in FIG. 5). The configuration bitstream may be stored locally on configuration DIMM 300 itself (see, e.g., FIG. 7, on configuration memory 700 or on configuration device 704) or may be received from an external host system (e.g., from external host 710).

At step 902, FPGA 100 may then be operated normally within system 200 to communicate with other microprocessors 206. Optionally, configuration DIMM 300 might include other FPGA-specific management features that are also active during normal operation, such as providing FPGA-specific clock signals, FPGA-specific thermal management control, or other FPGA-targeted auxiliary functions. During normal operation, FPGA 100 may communicate with conventional memory DIMMs 210 inserted into the other DIMM slots (step 904).

Although the methods of operations were described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

EXAMPLES

The following examples pertain to further embodiments.

Example 1 is an apparatus, comprising: a circuit board; a first socket on the circuit board; a microprocessor mounted in the first socket; a second socket on the circuit board, wherein the second socket is operable to receive an additional microprocessor in a first arrangement and to receive a programmable device in a second arrangement; and a slot on the circuit board, wherein the slot is coupled to the second socket via a memory channel, and wherein the slot is operable to receive a configuration module that configures the programmable device in the second arrangement.

Example 2 is the apparatus of example 1, wherein the programmable device optionally communicates with the microprocessor via a processor-to-processor interface on the circuit board in the second arrangement.

Example 3 is the apparatus of example 2, wherein the processor-to-processor interface optionally comprises an UltraPath Interconnect (UPI) interface.

Example 4 is the apparatus of any one of examples 2-3, optionally further comprising: an additional slot on the circuit board, wherein the additional slot is coupled to the second socket via an additional memory channel, and wherein the additional slot is operable to receive a memory module that provides primary storage for the additional microprocessor in the first arrangement and that provides primary storage for the programmable device in the second arrangement.

Example 5 is the apparatus of example 4, wherein the memory module optionally comprises a memory dual in-line memory module (DIMM) having dynamic random-access memory (DRAM) components, and wherein the configuration module optionally comprises a configuration dual in-line memory module (DIMM) having the same form factor as the memory DIMM.

Example 6 is the apparatus of any one of examples 1-5, wherein the configuration module optionally comprises configuration memory that provides configuration data to the programmable device in the second arrangement.

Example 7 is the apparatus of any one of examples 1-6, wherein the configuration module optionally comprises another programmable device that provides configuration data to the programmable device in the second arrangement.

Example 8 is the apparatus of any one of examples 1-7, wherein the configuration module optionally comprises a connector that is coupled to an external host, and wherein the external host provides configuration data to the programmable device in the second arrangement.

Example 9 is the apparatus of any one of examples 1-8, wherein the configuration module optionally comprises thermal control circuitry optimized to provide a cooling solution specific to the programmable device in the second arrangement.

Example 10 is the apparatus of any one of examples 1-9, wherein the configuration module optionally comprises clock drivers configured to generate clock signals meeting specific frequency and jitter requirements of the programmable device in the second arrangement.

Example 11 is the apparatus of any one of examples 1-10, wherein the first socket is optionally operable to receive another programmable device instead of the microprocessor.

Example 12 is a method, comprising: with a first processor socket, receiving a microprocessor; with a second processor socket that is structurally identical to the first processor socket, receiving a programmable device; with a slot that is coupled to the second processor socket, receiving a configuration module; and with the configuration module, programming the programmable device by providing a configuration bitstream to the programmable device.

Example 13 is the method of example 12, wherein the configuration module optionally comprises a configuration dual in-line memory module (DIMM).

Example 14 is the method of example 13, optionally further comprising: with an additional slot that is coupled to the second processor socket, receiving a memory dual in-line memory module (DIMM); and using the programmable device to send and receive memory signals to and from the memory DIMM during normal operation.

Example 15 is the method of example 14, optionally further comprising: using the configuration DIMM to provide management functions specific to the programmable device during normal operation.

Example 16 is circuitry, comprising: a programmable integrated circuit operable to be mounted in a processor socket, wherein the programmable integrated circuit comprises logic blocks, random-access memory (RAM) blocks, and digital signal processing (DSP) blocks, and wherein the programmable integrated circuit is operable to be configured by a configuration dual in-line memory module (DIMM) that is coupled to the processor socket.

Example 17 is the circuitry of example 16, wherein the programmable integrated circuit is optionally further operable to communicate with a memory dual in-line memory module (DIMM) that is coupled to the processor socket, and wherein the memory DIMM and the configuration DIMM have the same form factor.

Example 18 is the circuitry of any one of examples 16-17, wherein the processor socket is optionally further operable to receive a microprocessor.

Example 19 is the circuitry of any one of examples 16-18, wherein the configuration DIMM optionally comprises components that store a configuration bitstream for the programmable integrated circuit.

Example 20 is the circuitry of any one of examples 16-19, wherein the configuration DIMM optionally serves as a conduit for conveying a configuration bitstream to the programmable integrated circuit from an external host that is coupled to a connector on the configuration DIMM.

Example 21 is the circuitry of any one of examples 16-20, wherein the programmable integrated circuit optionally further comprises a secure device manager that receives a configuration bitstream from the configuration DIMM.

For instance, all optional features of the apparatus described above may also be implemented with respect to the method or process described herein. The foregoing is merely illustrative of the principles of this disclosure and various modifications can be made by those skilled in the art. The foregoing embodiments may be implemented individually or in any combination.

What is claimed is:

1. Circuitry, comprising:
a circuit board having a first processor socket, a second processor socket, and a slot;
a programmable integrated circuit mounted in the second processor socket; and
a configuration module mounted in the slot, wherein the configuration module configures the programmable integrated circuit.

2. The circuitry of claim 1, further comprising:
a microprocessor mounted in the first processor socket.

3. The circuitry of claim 1, wherein the second processor socket is further operable to receive a microprocessor.

4. The circuitry of claim 1, further comprising:
a memory channel configured to couple the second processor socket to the slot.

5. The circuitry of claim 1, further comprising:
a processor-to-processor interface configured to couple the first processor socket to the second processor socket.

6. The circuitry of claim 1, wherein the circuit board further comprises an additional slot configured to receive a memory module.

7. The circuitry of claim 1, wherein the circuit board further comprises an additional slot configured to receive another configuration module for configuring the programmable integrated circuit.

8. The circuitry of claim 5, wherein the processor-to-processor interface comprises an UltraPath Interconnect (UPI) interface.

9. The circuitry of claim 6, wherein the memory module is configured to provide primary storage for the programmable integrated circuit.

10. The circuitry of claim 6, wherein the configuration module and the memory module have the same form factor.

11. Circuitry, comprising:
a processor socket;
a programmable device mounted in the processor socket; and
a configuration module that programs the programmable device.

12. The circuitry of claim 11, wherein the configuration module comprises an in-line memory module.

13. The circuitry of claim 11, wherein the configuration module comprises a dual in-line memory module.

14. The circuitry of claim 11, further comprising:
an additional processor socket; and
an application-specific integrated circuit (ASIC) processor mounted in the additional processor socket.

15. The circuitry of claim 14, wherein the programmable device is configured to communicate with the ASIC processor.

16. A configuration module, comprising:
contact leads for coupling to an external programmable circuit; and
means for providing configuration data that is used to program the external programmable circuit, wherein the configuration module comprises an in-line memory module.

17. The configuration module of claim 16, wherein the means for providing the configuration data comprises configuration memory for storing the configuration data on the configuration module.

18. The configuration module of claim 16, wherein the means for providing the configuration data comprises a programmable configuration device.

19. The configuration module of claim 16, wherein the means for providing the configuration data comprises means for relaying the configuration data from an external host to the external programmable circuit.

* * * * *